United States Patent [19]
McIver

[11] 4,437,235
[45] * Mar. 20, 1984

[54] INTEGRATED CIRCUIT PACKAGE

[75] Inventor: Chandler H. McIver, Tempe, Ariz.

[73] Assignee: Honeywell Information Systems Inc., Phoenix, Ariz.

[*] Notice: The portion of the term of this patent subsequent to May 3, 2000 has been disclaimed.

[21] Appl. No.: 410,234

[22] Filed: Aug. 23, 1982

Related U.S. Application Data

[62] Division of Ser. No. 221,103, Dec. 29, 1980, Pat. No. 4,363,076.

[51] Int. Cl.³ ............................................. H05K 3/34
[52] U.S. Cl. ..................................... 29/840; 29/832; 174/52 FP; 174/52 PE
[58] Field of Search ........................ 29/827, 834, 840; 156/330; 174/52 PE, 52 FP

[56] References Cited

U.S. PATENT DOCUMENTS 3,325,582  6/1967  Ehrmann et al. .
3,849,187 11/1974  Fetscher et al. .
3,943,623  3/1976  Mizutani et al. .
3,962,520  6/1976  Watanabe et al. .
3,982,979  9/1976  Hentz et al. .
4,079,511  3/1978  Grabbe .
4,143,456  3/1979  Inove .
4,159,221  6/1979  Schuessler .
4,180,608 12/1979  Del .
4,312,116  1/1982  Moser et al. .

Primary Examiner—Howard N. Goldberg
Assistant Examiner—Carl J. Arbes
Attorney, Agent, or Firm—Edward W. Hughes; Wm. W. Holloway, Jr.; L. J. Marhoefer

[57] ABSTRACT

An integrated circuit package in which integrated circuit (I.C.) chips having flexible beam leads, the inner lead bond sites of which are bonded to input/output (I/O) terminals on the active faces of the chips, are mounted active face down on a surface of a substrate. The surface of the substrate is provided with chip sites and outer lead (OL) pads associated with each chip site. A preform of a fiber glass web coated with a thermosetting plastic is positioned on each chip site between a chip site and the active face of the I.C. chip. The plastic material of the preforms encapsulates the active faces of the chips, including a portion of each of the leads proximate a chip, and secures each chip to its chip site. The outer lead bond sites of the leads are bonded to OL pads of the substrate with the exposed portions of the leads between the OL pads and the encapsulated portion being bent away from the substrate and under compression.

1 Claim, 4 Drawing Figures

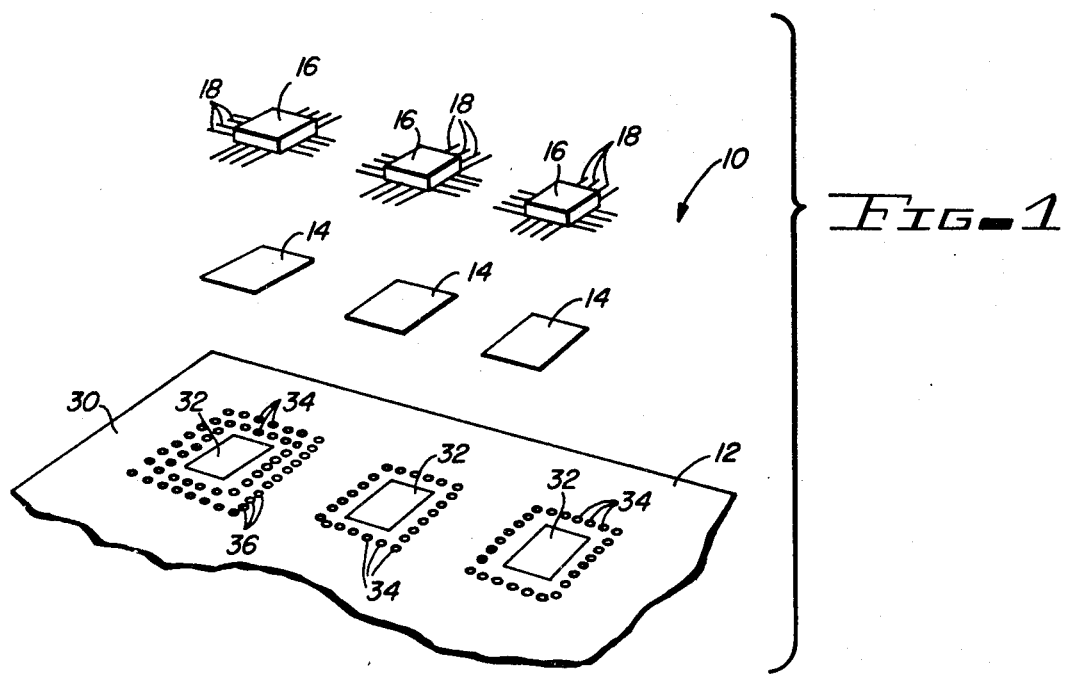
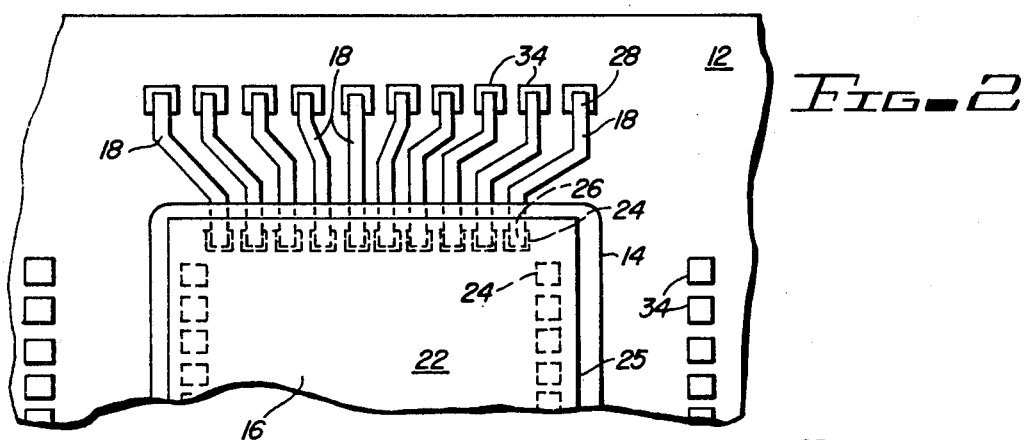
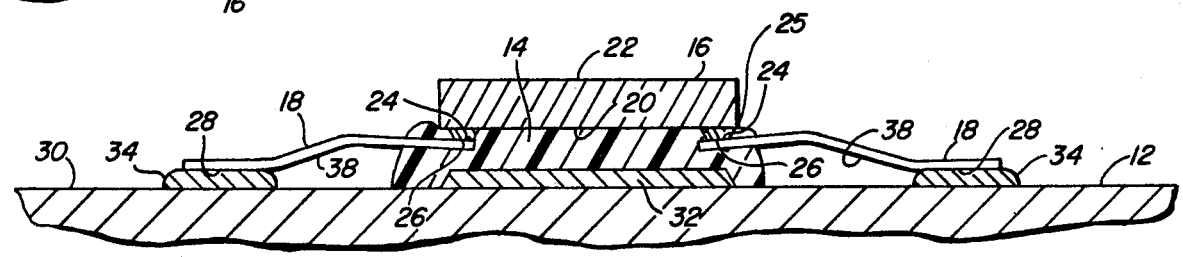
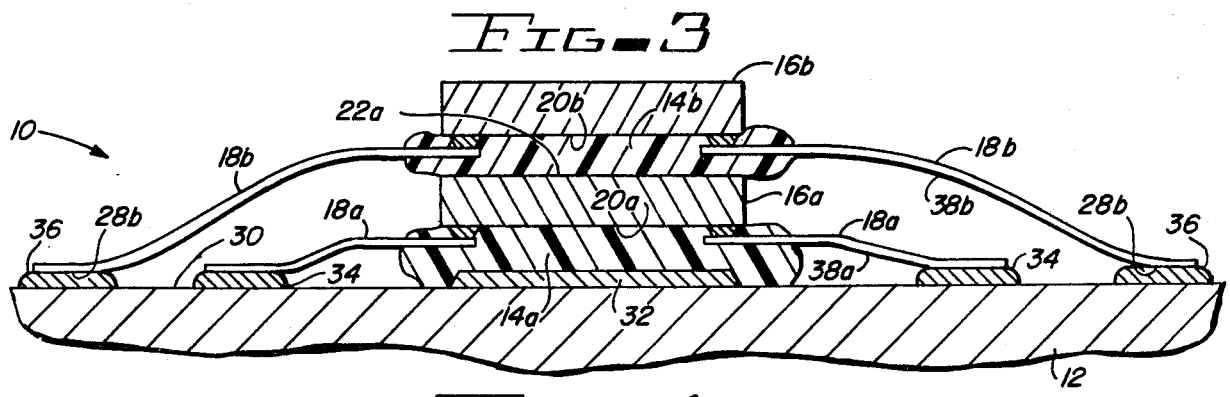

INTEGRATED CIRCUIT PACKAGE

This application is a division of application Ser. No. 221,103, filed Dec. 29, 1980, now U.S. Pat. No. 4,363,076, issued 12/7/82.

BACKGROUND OF THE INVENTION

1. Field of the Invention

This invention is in the field of packaging integrated circuit (I.C.) chips and more particularly relates to the field of packaging a plurality of I.C. chips on a substrate to form hybrid circuit packages.

2. Description of the Prior Art

I.C. chips, or dies, are generally packaged as either discrete devices, one chip per package, or as part of a multichip hybrid circuit, or hybrid package, where a plurality of I.C. chips are mounted in one such package. Each such hybrid package may be treated as a building block for complex electronic circuits and systems such as general purpose digital data processing systems.

In producing hybrid packages, an approach that lends itself to automating the process of mounting large-scale I.C. chips on a multilayer substrate involves producing flexible beam lead frames which are laminated to a strip of thin plastic material such as standard 35 mm film. The input/output (I/O) terminals on the active faces of the chips are bonded to inner lead bonding sites of the leads at the inner end of each lead of the lead frames. In order to mount such an I.C. chip on a substrate, the I.C. chips and a portion of their leads are blanked from the lead frames and from the film segments to which each frame is attached. The outer lead bonding sites of the leads attached to each I.C. chip are formed to produce a foot at the free end of each lead, the outer lead bonding site, which foot is substantially parallel to the active face of the I.C. chip but displaced so as to be substantially aligned with the bottom surface or back face of the chip. The back face of each such chip is metallized so that the back face can be soldered to a metallized chip site on the surface of the substrate simultaneously with the bonding of the outer lead sites of the leads to the outer lead pads of the substrate.

Problems associated with prior art hybrid packages having flexible beam leaded chips mounted on a fired multilayer substrate are the result of the additional manufacturing steps required to mount I.C. chips on substrates in this manner. One step is metallizing the back side of the I.C. chip, and another is the forming of the leads of the chip so that the outer bond sites of the leads will contact the I/O pads associated with each chip site of the substrate. Each additional manufacturing step increases the cost and decreases the reliability of the prior art hybrid packages. In addition, the prior art hybrid packages imposed the requirement on the I.C. chips that the thickness of such chips be maintained with tight tolerances to a predetermined value in order to reliably obtain good outer lead bonds. Since the active face of each chip with its I/O terminals to which the inner lead bond sites of the lead are bonded are exposed when the chips are mounted on a substrate, both the active face of the chips and their leads are subject to mechanical damage as well as to chemical attack or corrosion. Prior art packages of this type are also subject to edge shorts which occur if a lead touches the outer edge of the active face of an I.C. chip. It should also be noted that the bonds between inner lead bonding sites of the leads and the I/O terminals of the chips are physically weaker, i.e., they fail at lower tensile stresses than the bonds between the outer lead bonding sites of the leads and the I/O pads of the substrate.

SUMMARY OF THE INVENTION

The present invention provides an improved I.C. chip package particularly adapted for packaging a plurality of I.C. chips. Each I.C. chip has an active and a back surface, or face, which are substantially parallel to each other. A plurality of I/O terminals is formed on the active face. A plurality of flexible beam leads of a given lead frame, with each lead having an inner and an outer lead bonding site, has the inner lead bonding site of each lead bonded to an I/O terminal on the active face of a chip. The chip is mounted on the top surface of a substrate, which surface has chip pads with a plurality of OL pads associated with each chip pad formed thereon. A fiber glass mesh coated with a thermosetting plastic preform, the size of which substantially conforms to that of a chip site, is positioned on each chip site. A chip is secured to its chip site with its active face being encapsulated in the thermosetting plastic of the preform and with the outer lead bonding sites of its leads being bonded respectively to the OL pads associated with the chip site to which the I.C. chip is bonded. The plastic material of the preform also encapsulates a portion of the leads proximate the chip. Compression bonding of the outer lead bonding sites of the leads to the I/O pads places the leads in compression and causes the exposed portion of each lead, the portion between the outer lead bonding site of a lead and the portion encapsulated in the plastic of the preform, to bend away from the top surface of the substrate.

It is, therefore, an object of this invention to provide an improved hybrid package which can be manufactured at lower cost.

It is another object of this invention to provide a hybrid integrated circuit package in which the thickness of the I.C. chip is not critical and in which there is no need for the back face of the chip to be metallized.

It is still another object of this invention to encapsulate the active face of the I.C. chips and the inner portions of its leads in a plastic material which protects the inner lead bonds as well as the active face of the chip from both mechanical and chemical attack.

It is yet another object of this invention to provide an integrated circuit package in which the strength of inner lead bonds is increased by being encapsulated in a plastic material.

It is a further object of this invention to provide an integrated circuit package in which the number of I/C chips per unit area of substrate is substantially increased.

BRIEF DESCRIPTION OF THE DRAWINGS

Other objects, features and advantages of the invention will be readily apparent from the following description of certain preferred embodiments thereof, taken in conjunction with the accompanying drawings, although variations and modifications may be effected without departing from the spirit and scope of the novel concepts of the disclosure, and in which:

FIG. 1 is an exploded view of the integrated circuit package of this invention.

FIG. 2 is a broken away plan view of an I.C. chip mounted on a substrate on a greatly enlarged scale;

FIG. 3 is a sectional view through a chip mounted on a substrate of the package; and FIG. 4 is a view similar to FIG. 3 of a second embodiment of the invention.

DESCRIPTION OF THE INVENTION

In FIG. 1, the major elements of integrated circuit package, or assembly, 10 are illustrated. Package 10 comprises a substrate 12, preforms 14, and I.C. chips, or die, 16. Each I.C. chip 16 is provided with a plurality of flexible beam leads 18, the number of leads 18 of a chip 16 varies as a function of the number of gates, or complexity, of each I.C. chip 16 and ranges from 20-400 leads per chip, for example, in chips that are being produced at the present time, with the maximum number of leads per chip tending to increase with time.

As is better seen in FIGS. 2 and 3, large-scale I.C. chip 16 has a front, or active, face 20 and a back face 22, which faces are substantially parallel to each other. Located on active face 20 is a plurality of I/O terminals, or bumps, 24 which are made of a good electrical conductor, such as gold or copper for example. The I/O terminals 24 are commonly located near the outer perimeter 25 of active face 20 as illustrated in FIG. 2.

Each flexible beam lead 18 is provided with an inner lead bonding site 26 and an outer lead bonding site 28 with the sites 26 and 28 being on opposite sides of leads 18 as is best seen in FIG. 3. Beam leads 18 are made of a good electrical conductor, such as copper, by a photolithographic technique from a thin layer of a metallic foil which has been bonded or laminated to a segment of a strip of film. Prior to an I.C. chip 16 being mounted on substrate 12, leads 18 of a lead frame are bonded to the I/O terminals 24 on active face 20 of a chip 16 with the inner lead bonding site 26 of one lead 18 being bonded by conventional thermocompression processes, or soldering, to one I/O terminal 24. The bond, or electrical and mechanical connection, between an I/O terminal 24 and an inner lead bonding site 26 of a lead 18 is defined as being an inner lead bond. The bond or electrical and mechanical connection between an OL pad 34 and an outer lead bonding site 28 of a lead 18 is defined as being an outer lead bond. Substrate 12 is preferably a multilayer substrate with an alumina base and a plurality of layers of a good electrical conductor, or conductor runs, separated by layers of dielectrics with connections between conductors or different layers being by means of vias. A vias is an opening through a dielectric layer, which is filled by a good electrical conductor. The layers of conductors and dielectrics are conventionally screen printed onto the base of the substrate or onto the immediately previously formed layer. The layers are deposited as thick film pastes, either dielectric or conductor, each of which is fired in turn to produce multilayer substrate 12. The top surface 30 of substrate 12 has formed on it chip sites, or pads, 32. Associated with each chip, or die, pad 32, is a plurality of OL pads 34 arranged around the perimeter of each pad as seen in FIGS. 1 and 2, for example. Some or all of the chip pads 32 may have one or more additional outer rings of OL pads 36 positioned around the perimeter of a chip site 32 as illustrated in FIGS. 1 and 4. I/O pads 34, 36 are made of a good electrical conductor such as gold or copper. Chip sites 32 also may be a specifically designated area on surface 30, or they can be metallized, i.e., the designated area can be covered with a layer of a good thermal conductor, such as a layer of a conductor thick film paste in which the conductive material is gold, copper, or any other good thermal conductor to form chip pads 32. The purpose of the metallized chip pad 32 is primarily to aid in the dissipation of heat produced by an I.C. chip 16 which is mounted on the chip pad 32 as is described below.

Preforms 14 are small segments of a web of fiber glass, each of which has been coated with a suitable thermosetting plastic resin, such as a B-stage epoxy. In the preferred embodiment, the web is made of 1-mil diameter glass fiber filaments which are coated with the epoxy resin. Sheets of material from which preforms 14 can be formed, are commercially available from the Ablestik Laboratories of Gardena, CA, and are identified as Able Film 550K. Each preform 14 is sized so that it is substantially equal to, or congruent with, the chip site, or pad, 32 on which it is to be placed, or positioned. In the preferred embodiment, each preform 14 has a thickness in the range of from 3-5 mils.

Prior to placing preforms 14 on the chip pads 32 of a substrate 12, substrate 12 is preheated to a temperature in the range of from 110° to 120° C., at which temperature the thermosetting plastic coating of preforms 14 becomes tacky so that the preforms 14 will adhere to the chip pads 32 on which each is placed. Chips 16 are next placed on the preforms 14, active face 20 down, or in contact with the preform 14, and a force in the range of from 25-50 grams is applied to force the active face 20 of each chip 16 into a preform 14 to initiate the encapsulation of its active face 20, and the portions of the leads 18 near, or proximate, each chip 16 in the thermosetting plastic of the preform 14. The presence of glass filaments of the webs of each preform 14 minimizes the possibility that the active face 20 of a chip 16 will be forced into electrical or direct mechanical contact with the chip site 32 on which it is mounted which could cause electrical shorts between the active face 20 of chip 16 or between a chip face 20 and the substrate 12. Substrate 12 is then heated to a temperature of substantially 170° C. for substantially 20 minutes to partially cure the thermosetting plastic of the preforms 14. The position of each chip 16, while the plastic is still warm enough to permit a relatively easy movement, is adjusted so that the outer lead bonding site 28 of each flexible beam lead 18 substantially overlies the OL pad 34, or 36, to which it is to be bonded. While the thermosetting plastic is being partially cured, it will flow around the inner portions of the leads 18 between the active face 20 of each chip 16 with the result that the leads 18 will be physically isolated or separated from the outer edge 25 of each chip 16 by the plastic material of preform 14 as is seen in FIG. 3 for example. Since the thermosetting plastic resin of preform 14 is a good electrical insulator, the presence of the plastic material from preform 14 between the leads 18 and the front face 20 of each chip 16 prevents edge shorts.

The outer lead sites 28 of each lead 18 of each chip 16 to be mounted on the surface 30 of substrate 12 are preferably bonded to their corresponding I/O pads 34 or 36 by the application of heat and pressure, thermocompression bonding, with a suitable forming tool, as is well known in the art. Typically, the outer lead bonding sites 28 have been pretinned with a solder compatible with the metal from which the OL pads 34, 36 are fabricated so that when heated slightly above the temperature at which the solder melts, or reflows, a good solder bond is formed between each outer lead bonding site 28 of a lead 18 and the OL pad 34 or 36 to which it is bonded. The substantially simultaneous thermocompression bonding of all the leads 18 of a chip 16 to their corresponding OL pads 34, 36 places the leads 18 under a slight compression, which in turn causes the exposed portions 38 of each lead 18 to become slightly curved or bent as seen in FIG. 3 for example. The portion of a lead 18 between an OL pad 34 to which the outer lead bonding site 28 of the lead is bonded and the inner portion of the lead 18 which is encapsulated in the plastic material of preform 14 defines the exposed portion 38. After the outer lead bonding sites 28 of leads 18 are bonded to the OL pads 34 or 36, the package 10 is heated to a temperature of 180° C. for substantially 30 minutes which causes the thermosetting resin of the preforms 14 to become completely, or finally, cured.

To aid in dissipating heat produced by the chips 16 when energized, it is preferable that the thermosetting plastic of the preforms 14 be as good a thermal conductor as possible while the plastic retains its good electrical resistance characteristics and those characteristics that will cause the thermosetting plastic material to encapsulate the active face 20 of each I.C. chip 16. This is accomplished by loading or mixing with the plastic a good thermal conductor which is not a good electrical conductor, such as powdered alumina or beryllium oxide, as is well known in the art. A further aid to dissipating heat produced by chips 16, as well as an aid in minimizing hot spots in the chips 16, is to form the chip sites, or chip pads, 32 of a material having good thermal conductivity, such as gold, copper, silver, alumina, or the like.

To improve circuit density, i.e., the number of chips 16 that can be mounted per unit area on a substrate 12, it is possible with the packaging technique of this invention to mount more than one I.C. chip 16 on a given chip site 32. Referring to FIG. 4, I.C. chip 16a is mounted on chip pad 32 by means of preform 14a as described with respect to the embodiment of FIG. 3. The outer lead bonding sites of leads 18a of chip 16a are bonded to the inner ring of OL pads 34 on the top surface 30 of substrate 12, which I/O pads 34 are associated with chip pad 32. After the thermosetting plastic, or resin, of preform 14a has been finally cured, package 10 is preheated to a temperature in the range of from 110-120 C. and preform 14b is placed on the back face 22a of chip 16a to which it will adhere since at this temperature the thermosetting resin of preform 14b is tacky. Chip 16b is then placed with its active face 20b in contact with preform 14b and is pushed or forced down into preform 14b with a force of from 20-50 grams to initiate the encapsulation of face 20b of chip 16b in the thermosetting plastic of preform 14b. The portions of leads 18b near or proximate chip 16b are also encapsulated in the plastic material of preform 14b, which plastic material will flow between each of the leads 18b and the front face 20b of chip 16b. The temperature of assembly 10 is heated to a temperature of substantially 170° C. for a period of substantially 20 minutes to partially cure the thermosetting plastic of preform 14b. Chip 16b is then positioned so that its outer lead bonding sites 28b will overlie their corresponding OL pads 36 on substrate 12. During this period of time in which the thermosetting plastic of preform 14b is being partially cured, it will completely encapsulate the active face 20b of I.C. chip 16b and flow around the inner portions of leads 18b and between the face 20b of chip 16b and leads 18b. Outer lead bond sites 28b of leads 18b are then bonded to the second, or outer, row of OL pads 36 by the application of heat and pressure to form a good mechanical and electrical bond. Thermocompression bonding of outer lead bonding sites 28b of the leads 18b to the OL pads 36 places leads 18b under compression which causes the exposed portions 38b of leads 18b to bend away from surface 30 slightly as seen in FIG. 4. After the outer lead bonds between leads 18b and OL pads 36, for example, have been made, package 10 is then heated to a suitable temperature, i.e., around 180° C., for a suitable period of time, 30 minutes, which is determined by the particular thermosetting epoxy used to cause the epoxy of preform 14b to become completely cured.

The placing of the leads 18 so that they are under compression and slightly bent as illustrated has the advantage of preventing a change in the direction of the stresses to which each lead 18 is subjected in normal use. A change in the direction of such stresses can break the inner or outer lead bonds of the leads as the temperature changes. As a result, in the packages of this invention leads 18 will stay in compression even when the temperature of the ambient environment is at the lowest operational limit of package 10. Increases in temperature do not lead to significantly higher stress forces on the leads 18, but rather such higher temperatures have the effect of increasing the amount of bending of the leads away from surfaces 30. The encapsulation of the active surfaces to the chips 16 in plastic increases the strengths of the inner lead bonds of the leads 18 to the I/O terminals 24, while also protecting the active faces 20 of the chips 16 from attack by any chemical materials that may be present in the ambient atmosphere of package 10.

It should be evident that various modifications can be made to the described invention and its embodiments without departing from the scope of the present invention.

What is claimed is:

1. Method of mounting an integrated circuit chip having an active face having outer edges, a back face and a plurality of input/output terminals on the active face thereof with a plurality of flexibe beam leads, each of said leads having an inner and an outer lead site, with the inner lead site of each lead being bonded respectively to an input/output terminal of the integrated circuit chip, on a substrate having a top surface with a chip pad formed on the top surface and a plurality of outer lead pads associated with the chip pad comprising the steps of:

preheating the substrate to a first temperature range at which a given thermosetting plastic becomes tacky;

placing a preform comprised of a segment of the web coated with the thermosetting plastic which plastic is electrically insulating and thermally conductive on the chip pad to cause the preform to adhere to the pad, said preform substantially covering the chip pad;

placing the integrated circuit chip on the preform, active face down, and applying a force to the back of the chip to initiate encapsulation of the active face, and portions of the leads proximate the input/output terminals of the chip in the thermosetting plastic of the preform;

heating the substrate, chip and preform to a second temperature for a first predetermined period of time to partially cure the thermosetting plastic of the preform to cause the plastic to flow around the inner portions of the leads between the active face of the chip and the chip pad;

positioning the chip while the plastic is partially cured so that the outer lead bonding site of each beam lead substantially overlies the outer lead pad to which it to be bonded;

thermocompressively bonding the outer lead bonding sites of the leads to the outer lead pads to place the leads under compression; and heating the thermoplastic material to a third temperature for a second predetermined period of time to substantially cure the thermosetting plastic.

* * * * *